(12) United States Patent
Matsuzuka et al.

(10) Patent No.: US 9,543,902 B2
(45) Date of Patent: Jan. 10, 2017

(54) POWER AMPLIFIER

(71) Applicant: Mitsubishi Electric Corporation, Tokyo (JP)

(72) Inventors: Takayuki Matsuzuka, Tokyo (JP); Junichi Udomoto, Tokyo (JP); Tetsuo Kunii, Tokyo (JP); Hiromitsu Utsumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/926,913

(22) Filed: Oct. 29, 2015

(65) Prior Publication Data
US 2016/0285421 A1 Sep. 29, 2016

(30) Foreign Application Priority Data

Mar. 24, 2015 (JP) ................. 2015-060595

(51) Int. Cl.
*H03F 3/04* (2006.01)
*H03F 1/02* (2006.01)
*H03F 1/56* (2006.01)
*H03F 3/193* (2006.01)
*H03F 3/21* (2006.01)

(52) U.S. Cl.
CPC ............. *H03F 1/0205* (2013.01); *H03F 1/56* (2013.01); *H03F 3/193* (2013.01); *H03F 3/211* (2013.01); *H03F 2200/451* (2013.01); *H03F 2203/21106* (2013.01)

(58) Field of Classification Search
CPC ........................................................ H03F 3/04

USPC .................................. 330/302, 277; 333/218
See application file for complete search history.

(56) References Cited

U.S. PATENT DOCUMENTS

| 6,812,794 | B1 * | 11/2004 | Mori | H03F 1/565 330/277 |
| 8,076,994 | B2 * | 12/2011 | Farrell | H01L 23/66 330/302 |
| 2004/0145034 | A1 * | 7/2004 | Fujioka | H01L 23/66 257/664 |
| 2007/0296505 | A1 * | 12/2007 | Oka | H03F 1/56 330/302 |

(Continued)

FOREIGN PATENT DOCUMENTS

JP H02-061175 B2 12/1990

*Primary Examiner* — Patricia T Nguyen
(74) *Attorney, Agent, or Firm* — Studebaker & Brackett PC

(57) ABSTRACT

A power amplifier includes: an amplifier; an input matching circuit connected to an input of the amplifier; an output matching circuit connected to an output of the amplifier; and a low-frequency processing circuit connected to the input matching circuit or the output matching circuit, wherein the low-frequency processing circuit includes a first line having a first end connected to the input matching circuit or the output matching circuit, a first shot stub connected to a second end of the first line and including a second line and a first capacitor connected in series each other, and a second short stub connected to the second end of the first line in parallel with the first short stub and including a third line and a second capacitor which are connected in series each other, the first line has a length of λ/8, the second line has a length of λ/4, and the third line has a length of λ/8 with respect to a wavelength λ of a fundamental frequency.

8 Claims, 10 Drawing Sheets

(56) References Cited

U.S. PATENT DOCUMENTS

| | | | |
|---|---|---|---|
| 2012/0262234 A1* | 10/2012 | Lee | H03F 1/3241 330/149 |
| 2014/0218105 A1* | 8/2014 | Aoki | H03F 1/565 330/65 |
| 2015/0235941 A1* | 8/2015 | Nishijima | H01L 23/528 333/17.3 |

* cited by examiner

POWER AMPLIFIER

BACKGROUND OF THE INVENTION

Field of the Invention

The present invention relates to a communication power amplifier intended mainly for satellite communication.

Background Art

Traveling wave tube amplifiers (TWTA) have been used so far as satellite communication power amplifiers, but TWTAs are being increasingly replaced by solid-sate amplifiers (SSPA) using FETs (field-effect transistors) such as GaAs (gallium arsenide) or GaN (gallium nitride) from the standpoints of cost and reliability in recent years. In power amplifiers, a low-frequency processing circuit is connected to an input matching circuit or an output matching circuit to provide high impedance at an operating frequency (fundamental frequency) and low impedance at a low frequency of the power amplifiers. In this way, the power amplifiers suppress intermodulation distortion while reducing influences of an RF signal on output power or efficiency. Conventional low-frequency processing circuits are made up of lines and capacitors connected to one another in series (e.g., see Japanese Patent Publication No. 2-61175).

SUMMARY OF THE INVENTION

As a technique for improving FET efficiency, a technique is known which optimizes impedance of matching circuits not only at a fundamental frequency but also at a second harmonic frequency. However, the conventional low-frequency processing circuits have low impedance at a frequency (second harmonic frequency) double the operating frequency of an RF signal. Therefore, when a conventional low-frequency processing circuit is added to a power amplifier whose impedance at the second harmonic frequency is optimized, there is a problem that the impedance at the second harmonic frequency is affected by the low-frequency processing circuit and deviates from optimum impedance.

Furthermore, attempting to design a low-frequency processing circuit so as to have high impedance with respect to the fundamental frequency and the second harmonic frequency would conventionally result in a problem that a transmission line making up the low-frequency processing circuit becomes longer, increasing the circuit scale.

The present invention has been implemented to solve the above-described problems and it is an object of the present invention to provide a power amplifier capable of reducing influences of an RF signal at a fundamental frequency and a second harmonic frequency on output power and efficiency, suppressing intermodulation distortion and reducing the size of the circuit.

According to the present invention, a power amplifier includes: an amplifier; an input matching circuit connected to an input of the amplifier; an output matching circuit connected to an output of the amplifier; and a low-frequency processing circuit connected to the input matching circuit or the output matching circuit, wherein the low-frequency processing circuit includes a first line having a first end connected to the input matching circuit or the output matching circuit, a first shot stub connected to a second end of the first line and including a second line and a first capacitor connected in series each other, and a second short stub connected to the second end of the first line in parallel with the first short stub and including a third line and a second capacitor which are connected in series each other, the first line has a length of λ/8, the second line has a length of λ/4, and the third line has a length of λ/8 with respect to a wavelength λ of a fundamental frequency.

In the present invention, the low-frequency processing circuit includes a first line and first and second short stub connected in parallel to the first line. The first line has a length of λ/8, the second line of the first short stub has a length of λ/4, and the third line of the second short stub has a length of λ/8. Therefore, it is possible to reduce influences of the RF signal at the fundamental frequency and the second harmonic frequency on the output power and efficiency, suppress intermodulation distortion and reduce the size of the circuit.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
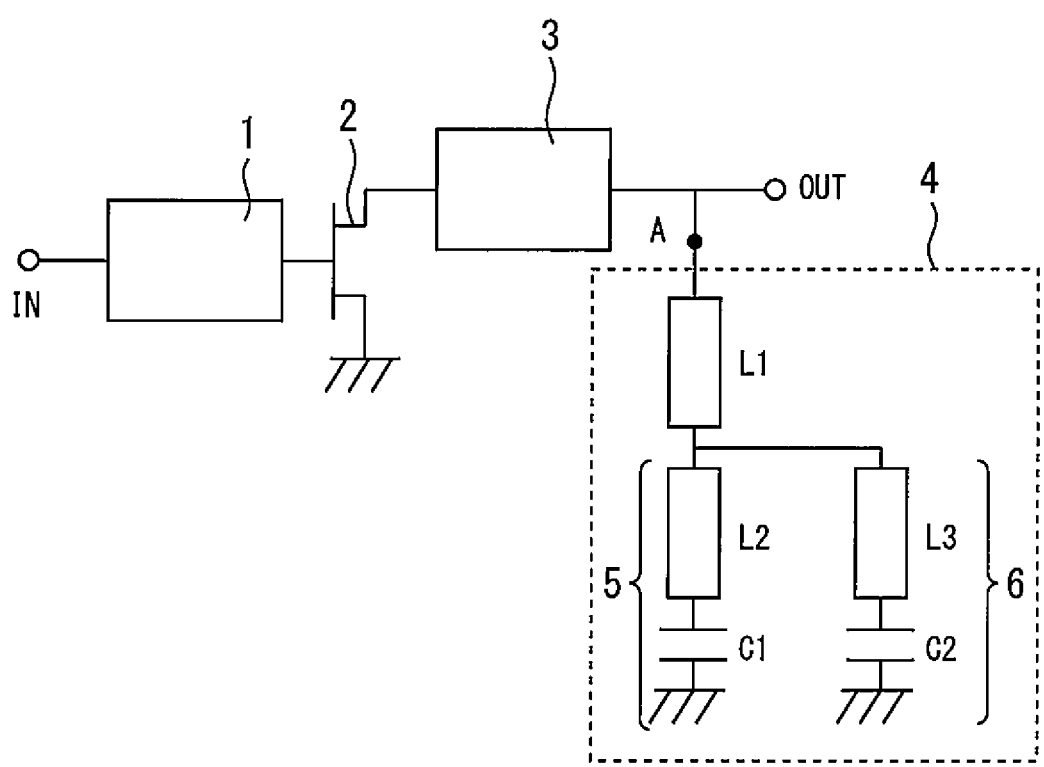
FIG. 1 is a circuit diagram illustrating a power amplifier according to a first embodiment of the present invention.

FIG. 1 is a circuit diagram illustrating a power amplifier according to a first embodiment of the present invention. An input matching circuit 1 is connected to an input of an FET 2 and an output matching circuit 3 is connected to an output of the FET 2. An RF signal inputted from an input terminal IN is amplified by the FET 2 and outputted from an output terminal OUT.

A low-frequency processing circuit 4 is connected between the output matching circuit 3 and a grounding terminal. The low-frequency processing circuit 4 includes a line L1, and short stubs 5 and 6. One end of the line L1 is connected to the output matching circuit 3. The short stub 5 includes a line L2 and a capacitor C1 connected in series between the other end of the line L1 and the grounding terminal. The short stub 6 is connected between the other end of the line L1 and the grounding terminal in parallel with the short stub 5 and includes a line L3 and a capacitor C2 connected in series.

With respect to a wavelength λ which is an operating frequency (fundamental frequency) of the power amplifier, the line L1 has a length of λ/8, the line L2 has a length of λ/4, and the line L3 has a length of λ/8. The capacitor C1 has a capacitance (generally on the order of 100 to 10000 pF) which has low impedance at a low frequency and the capacitor C2 has a capacitance (generally around 10 pF, for example, when the fundamental frequency is 14 GHz) which has low impedance at a fundamental frequency.

Figure 2:
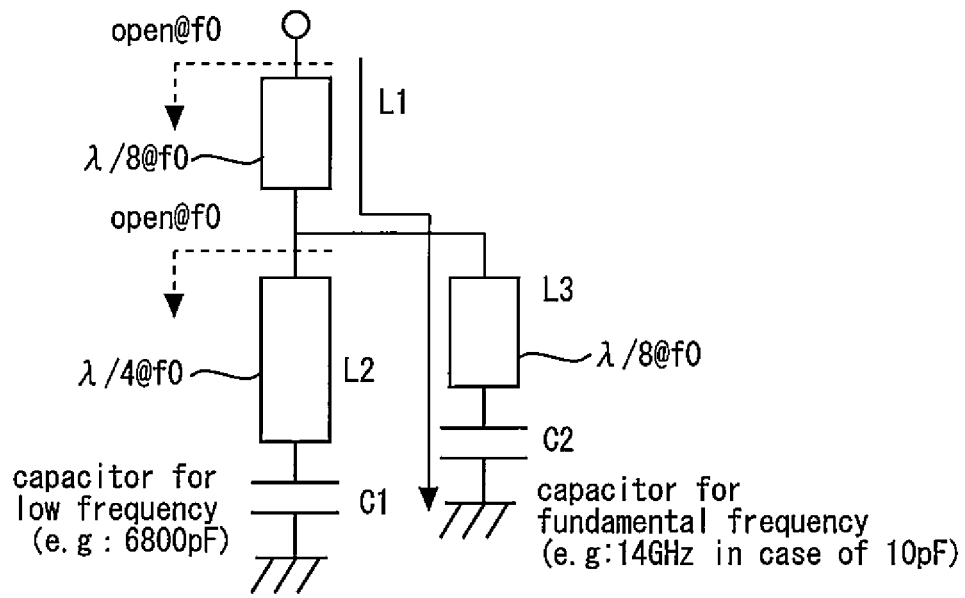
FIG. 2 is a diagram for describing impedance at a fundamental frequency (f0) when the low-frequency processing circuit is seen from point A of FIG. 1.

FIG. 2 is a diagram for describing impedance at a fundamental frequency (f0) when the low-frequency processing circuit is seen from point A of FIG. 1. The short stub 5 including the line L2 having a length of λ/4 with respect to the wavelength λ of the fundamental frequency and the low frequency capacitor C1 has high impedance with respect to the fundamental frequency. For this reason, of the two short stubs 5 and 6, it is the short stub 6 that has a main influence on impedance. When seen as the low-frequency processing circuit 4, the transmission path of the RF signal that determines impedance is the line L1, the line L3 and the capacitor C2. The capacitor C2 short-circuits the fundamental frequency, and since the sum of lengths of the line L1 and the line L3 is λ/4, the low-frequency processing circuit 4 as a whole has high impedance with respect to the fundamental frequency.

Figure 3:
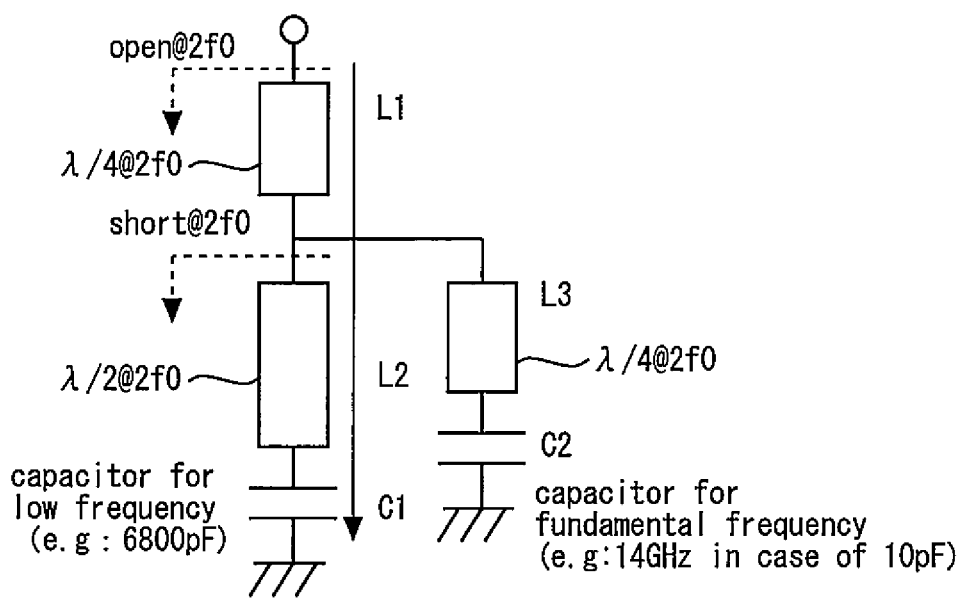
FIG. 3 is a diagram for describing impedance at a second harmonic frequency (2f0) when the low-frequency processing circuit is seen from point A of FIG. 1.

FIG. 3 is a diagram for describing impedance at a second harmonic frequency (2f0) when the low-frequency processing circuit is seen from point A of FIG. 1. Since the line L2 has a length of λ/2 with respect to a wavelength λ of the second harmonic frequency, the short stub 5 including the line L2 and the low frequency capacitor C1 has low impedance with respect to the second harmonic frequency. For this reason, of the two short stubs 5 and 6, it is the short stub 5 that has a main influence on impedance. When seen as the low-frequency processing circuit 4, the transmission path of the RF signal that determines impedance is the line L1, the line L2 and the capacitor C1. Since the line L1 has a length of λ/4 with respect to the second harmonic frequency, the low-frequency processing circuit 4 as a whole has high impedance at the second harmonic frequency Regarding impedance at a low frequency (corresponding to difference frequency of intermodulation distortion), it is possible to achieve low impedance by increasing the capacitance of the capacitor C1. For example, when the difference frequency of intermodulation distortion is 1 MHz to several hundreds of MHz, the capacitance of the capacitor C1 is often set to the order of 100 to 10000 pF.

Figure 4:
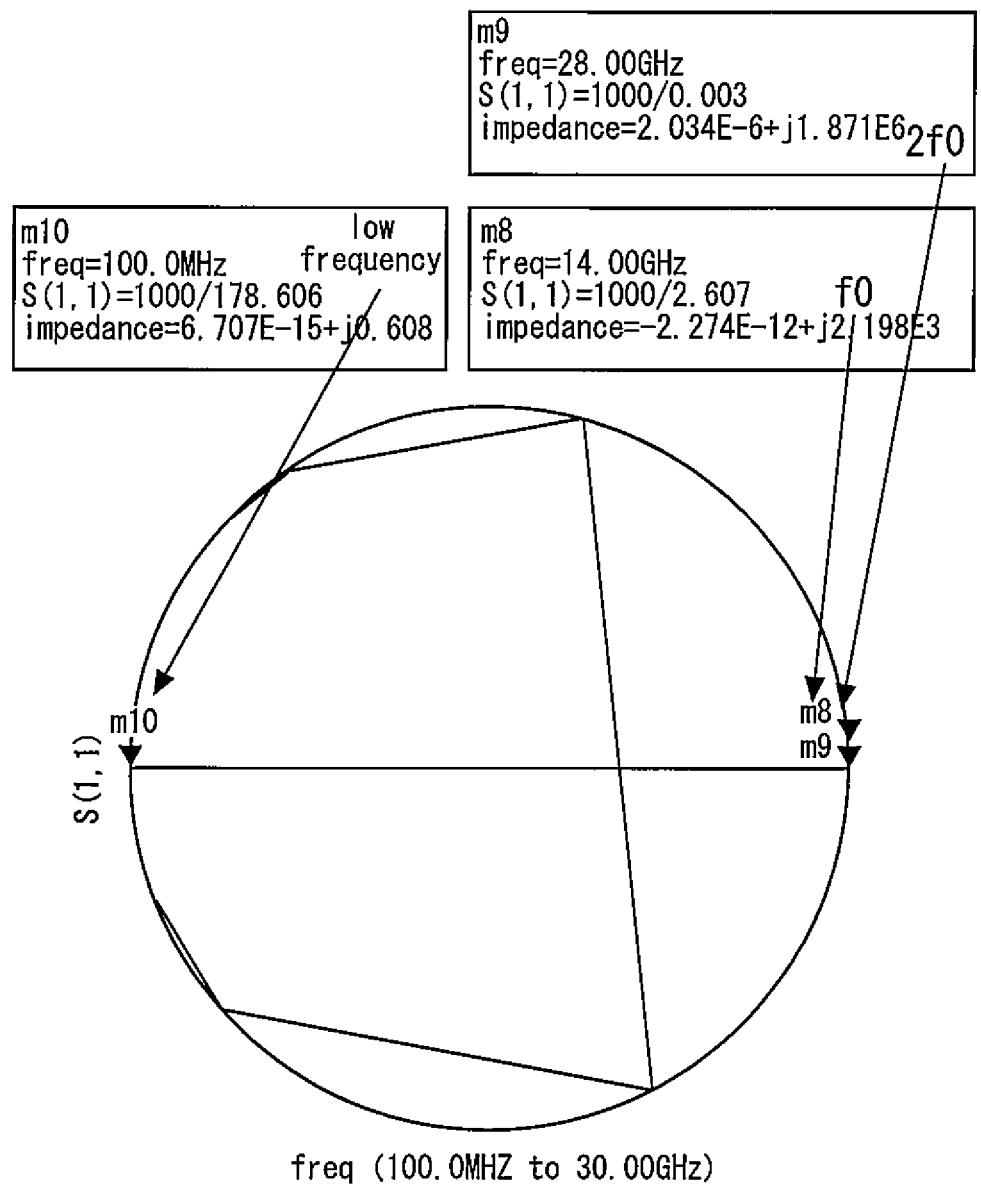
FIG. 4 is a diagram illustrating a simulation result of impedance of the low-frequency processing circuit according to the first embodiment of the present invention.

FIG. 4 is a diagram illustrating a simulation result of impedance of the low-frequency processing circuit according to the first embodiment of the present invention. Each line and capacitance value are designed assuming that the fundamental frequency is 14 GHz. It is observed that low impedance is achieved at a low frequency (the marker in the drawing represents 100 MHz) and high impedance is achieved at a fundamental frequency and a second harmonic frequency (14 GHz and 28 GHz respectively).

Figure 5:
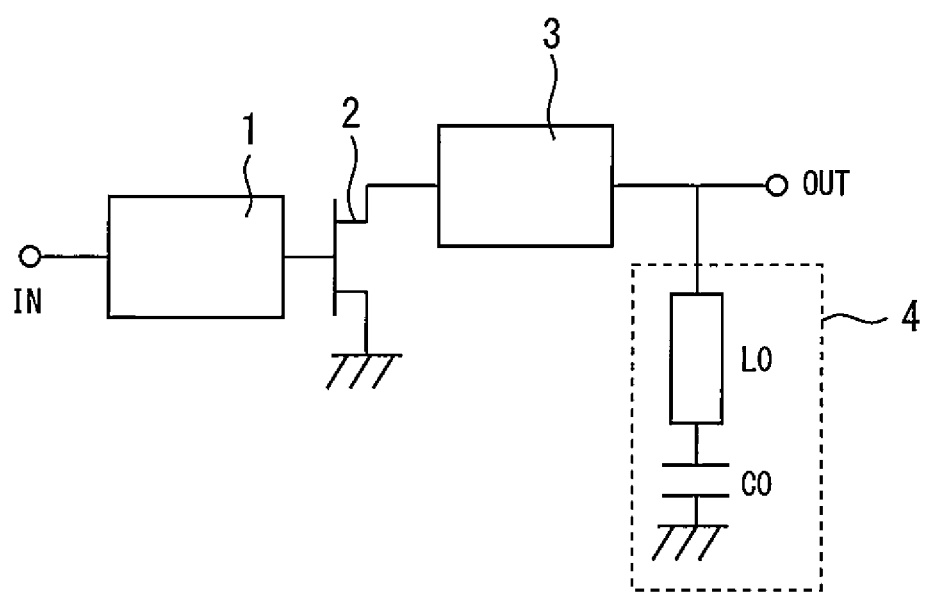
FIG. 5 is a circuit diagram illustrating a power amplifier according to the comparative example.

Next, effects of the present embodiment will be described in comparison with a comparative example. FIG. 5 is a circuit diagram illustrating a power amplifier according to the comparative example. A low-frequency processing circuit 4 is constructed of a line L0 and a capacitor C0 connected in series. A length of the line L0 with respect to the wavelength λ of the operating frequency (fundamental frequency) of the RF signal is λ/4. The capacitor C0 is short-circuited at a low frequency (corresponding to the difference frequency of intermodulation distortion, normally on the order of 1 MHz to several hundreds of MHz). Therefore, the low-frequency processing circuit 4 has high impedance at the operating frequency of the RF signal and low impedance at the low frequency. The power amplifier suppresses intermodulation distortion while reducing influences of the RF signal on output power and efficiency. However, since the low-frequency processing circuit 4 of the comparative example has low impedance at the second harmonic frequency, the impedance at the second harmonic frequency is affected by the low-frequency processing circuit 4 and deviates from optimum impedance.

In contrast, the present embodiment sets the length of the line L1 of the low-frequency processing circuit 4 to λ/8, the length of the line L2 of the short stub 5 to λ/4, and the length of the line L3 of the short stub 6 to λ/8. Thus, the low-frequency processing circuit 4 has high impedance with respect to the fundamental frequency and the second harmonic frequency of the FET 2 and low impedance with respect to the difference frequency of intermodulation distortion without extending the transmission line making up the low-frequency processing circuit 4 so much. Therefore, it is possible to reduce influences of the RF signal at the fundamental frequency and the second harmonic frequency on the output power and efficiency, suppress intermodulation distortion and reduce the size of the circuit.

Note that although the low-frequency processing circuit 4 is connected between the output matching circuit 3 and the output terminal OUT in the present embodiment, similar effects can be obtained even when the low-frequency processing circuit 4 is connected between the FET 2 and the output matching circuit 3 or connected on the input matching circuit 1 side.

Second Embodiment

Figure 6:
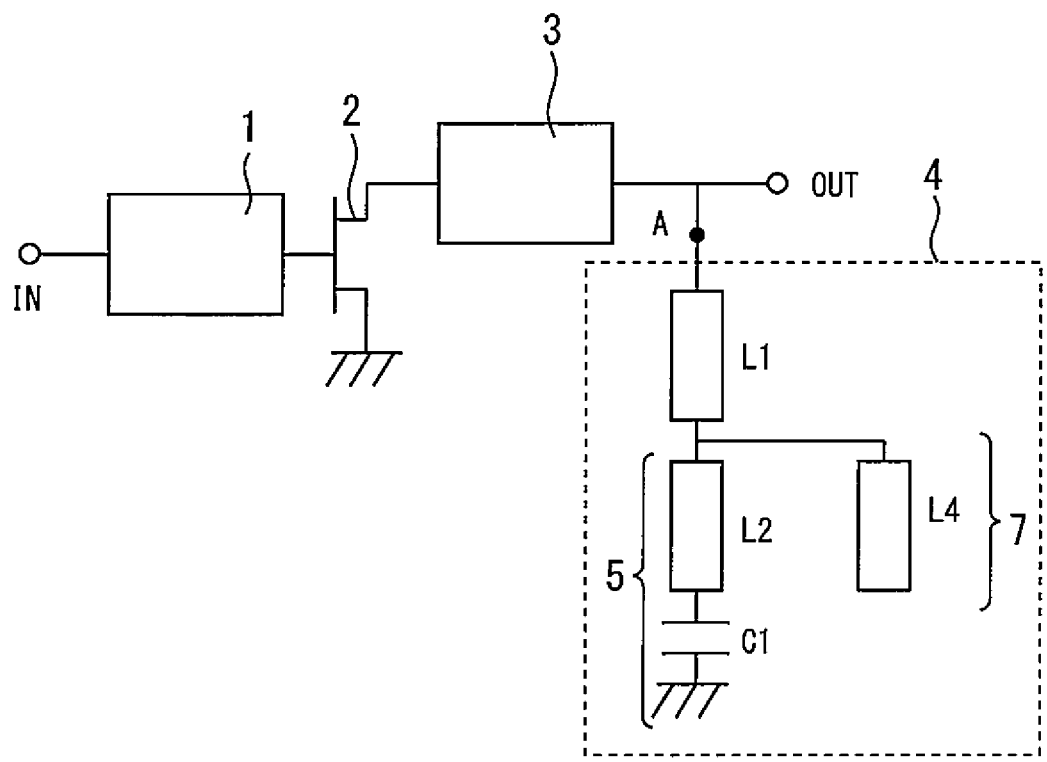
FIG. 6 is a circuit diagram illustrating a power amplifier according to a second embodiment of the present invention.

FIG. 6 is a circuit diagram illustrating a power amplifier according to a second embodiment of the present invention. In the present embodiment, the short stub 6 in the first embodiment is replaced by an open stub 7. The open stub 7 includes a line L4 connected to the other end of the line L1. The line L4 has a length of 37λ/8 with respect to the wavelength λ of the fundamental frequency.

Figure 7:
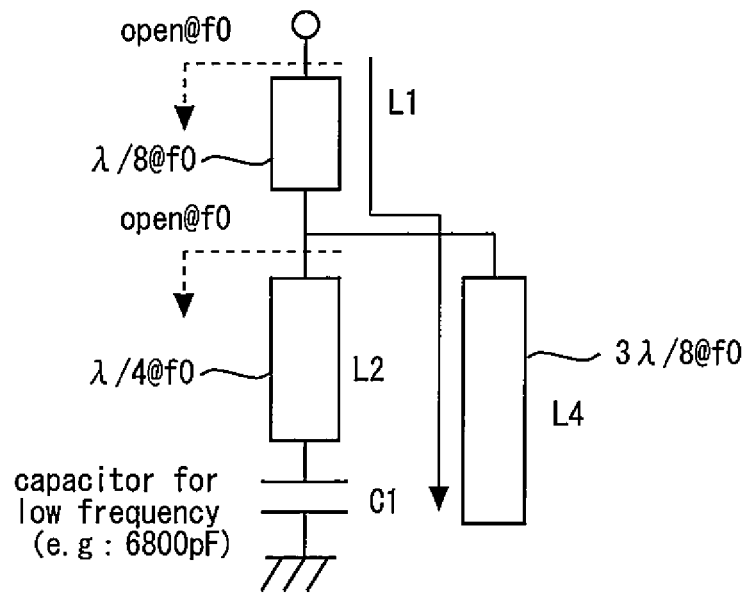
FIG. 7 is a diagram for describing impedance at a fundamental frequency (f0) when the low-frequency processing circuit is seen from the point A of FIG. 6.
Figure 8:
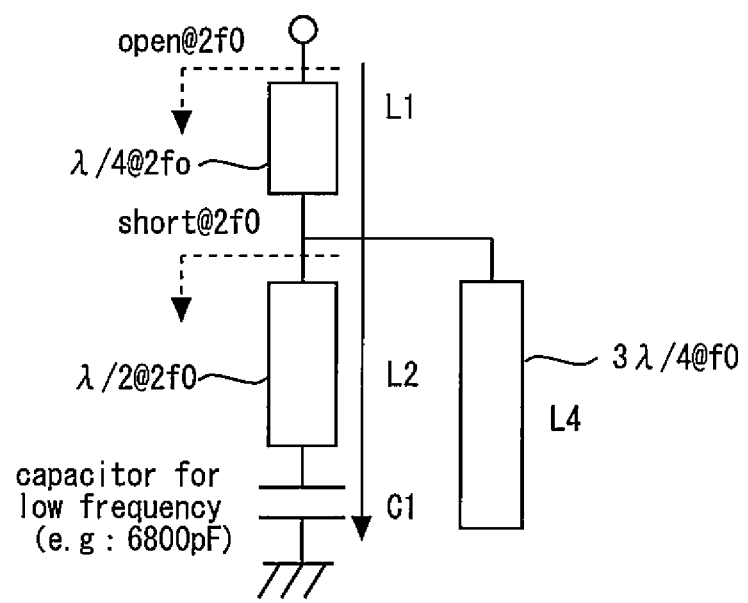
FIG. 8 is a diagram for describing impedance at a second harmonic frequency (2f0) when the low-frequency processing circuit is seen from the point A of FIG. 6.
Figure 9:
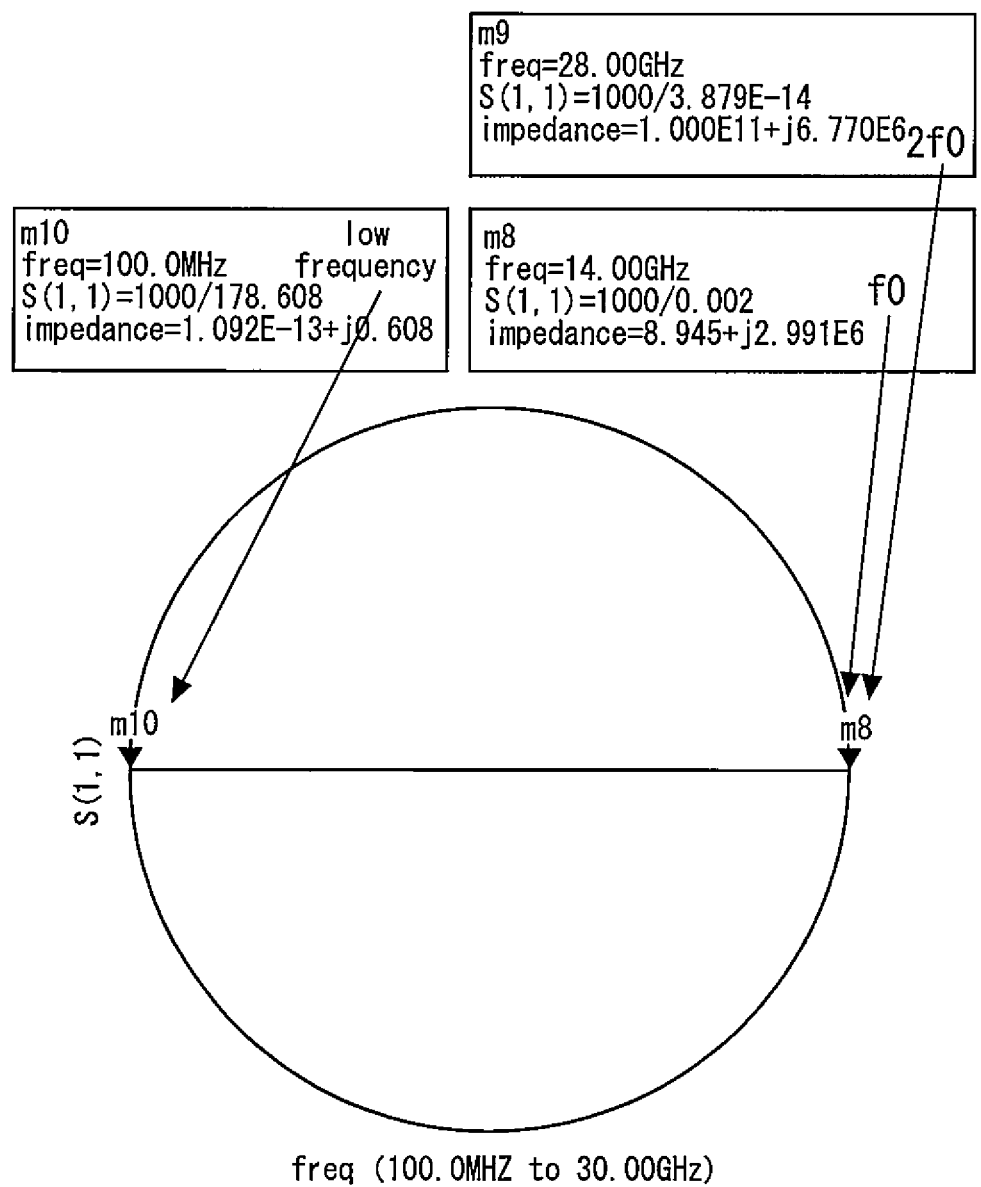
FIG. 9 is a diagram illustrating a simulation result of impedance of the low-frequency processing circuit according to the second embodiment of the present invention.

FIG. 7 is a diagram for describing impedance at a fundamental frequency (f0) when the low-frequency processing circuit is seen from the point A of FIG. 6. FIG. 8 is a diagram for describing impedance at a second harmonic frequency (2f0) when the low-frequency processing circuit is seen from the point A of FIG. 6. FIG. 9 is a diagram illustrating a simulation result of impedance of the low-frequency processing circuit according to the second embodiment of the present invention. Operation of the low-frequency processing circuit 4 according to the present embodiment is similar to that of the first embodiment.

As in the case of the first embodiment, the low-frequency processing circuit 4 of the present embodiment has high impedance with respect to the fundamental frequency and the second harmonic frequency of the FET 2, and low impedance with respect to the difference frequency of intermodulation distortion. In this way, it is possible to reduce influences of the RF signal at the fundamental frequency and the second harmonic frequency on the output power and efficiency, suppress intermodulation distortion and reduce the size of the circuit. In addition, since the number of capacitors can be reduced by one compared to the first embodiment, the present embodiment is advantageous in terms of cost.

Third Embodiment

Figure 10:
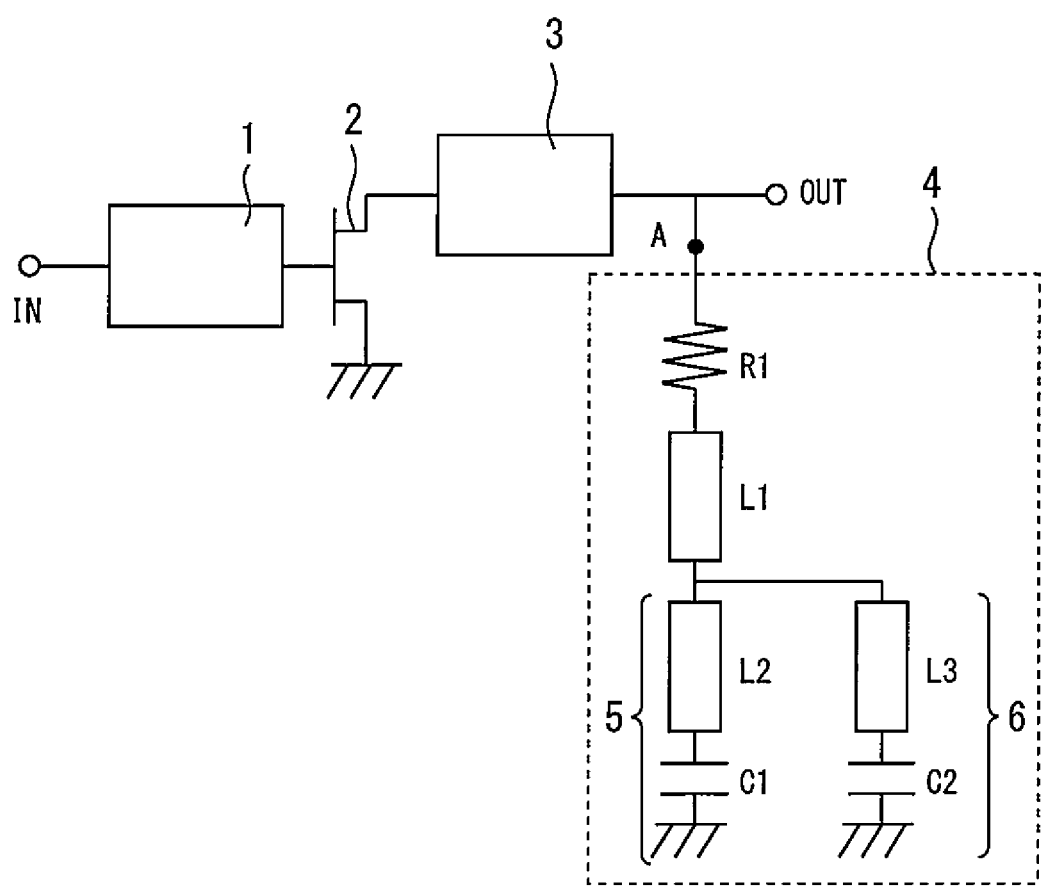
FIG. 10 is a circuit diagram illustrating a power amplifier according to a third embodiment of the present invention.

FIG. 10 is a circuit diagram illustrating a power amplifier according to a third embodiment of the present invention. In the present embodiment, a resistor R1 is connected between point A and the line L1 in addition to the configuration of the first embodiment.

The FET 2 is normally designed to have a higher gain for a lower frequency and reduce the gain outside an operating frequency band through a matching circuit or the like, but its operation may become unstable due to an oscillation that may occur at a low frequency. In contrast, the low-frequency processing circuit 4 has low impedance at a low frequency, and therefore adding the resistor R1 causes a low frequency signal to attenuate and can improve stability. On the other hand, since point A has high impedance at the fundamental frequency or the second harmonic frequency, the influence of adding the resistor R1 is small.

Fourth Embodiment

Figure 11:
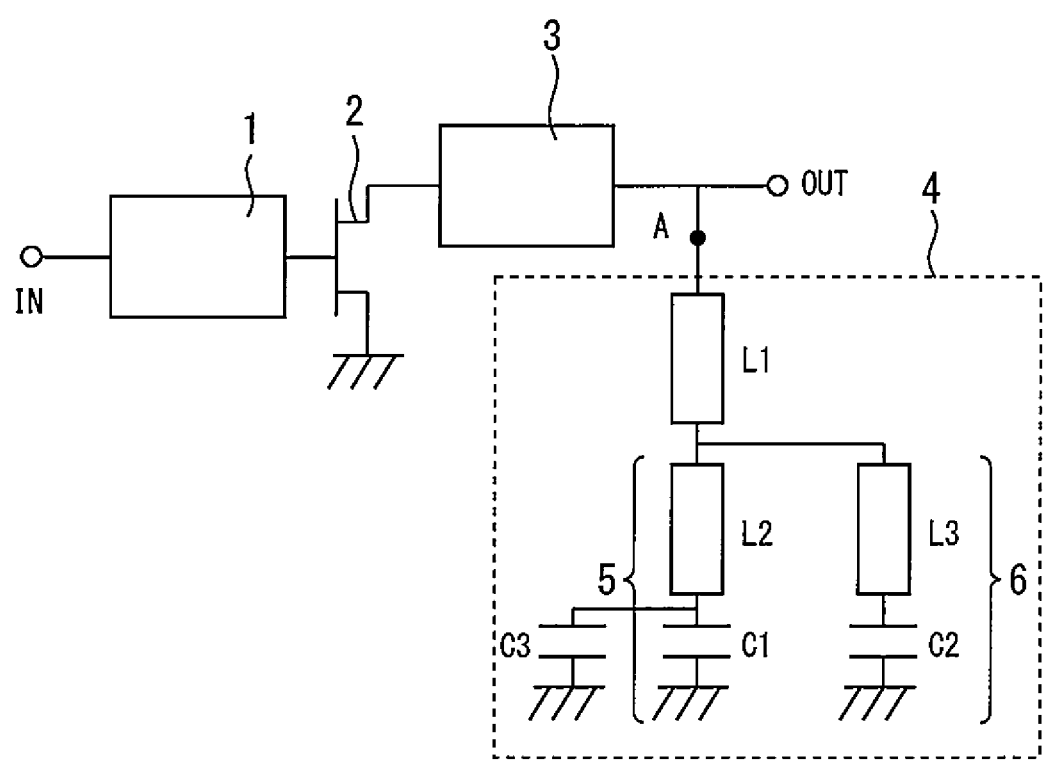
FIG. 11 is a circuit diagram illustrating a power amplifier according to a fourth embodiment of the present invention.

FIG. 11 is a circuit diagram illustrating a power amplifier according to a fourth embodiment of the present invention. In the present embodiment, a capacitor C3 is connected in parallel with the capacitor C1 in addition to the configuration of the first embodiment. The capacitor C1 has low impedance with respect to a low frequency, whereas the capacitor C3 has low impedance with respect to a fundamental frequency and a second harmonic frequency (e.g., around 10 pF when the fundamental frequency is 14 GHz).

When a capacitor having a relatively large parasitic inductance (laminated ceramic capacitor having a large capacitance or the like) is used as the capacitor C1 which has low impedance at a low frequency, the contribution of this parasitic inductance becomes dominant in the impedance of the capacitor C1 at the fundamental frequency or the second harmonic frequency.

For this reason, in the first embodiment, the impedance of the short stub 5 constructed of the line L2 and the capacitor C1 at the fundamental frequency and the second harmonic frequency deviates from ideal impedance (high impedance at the fundamental frequency and low impedance at the second harmonic frequency). Moreover, since management of the parasitic component is generally difficult, there is concern that a manufacturing variation in impedance of the low-frequency processing circuit 4 at the fundamental frequency or the second harmonic frequency may increase due to influences of the parasitic inductance.

In contrast, the present embodiment adds the capacitor C3 (e.g., single layer ceramic capacitor) having a small parasitic inductance to create a low impedance point at the fundamental frequency or the second harmonic frequency in parallel with the capacitor C1, and therefore the operation of the low-frequency processing circuit 4 further approximates to an ideal operation. Furthermore, since the impedance at the fundamental frequency or the second harmonic frequency becomes stable, it is possible to suppress manufacturing variations in impedance of the low-frequency processing circuit 4.

Fifth Embodiment

Figure 12:
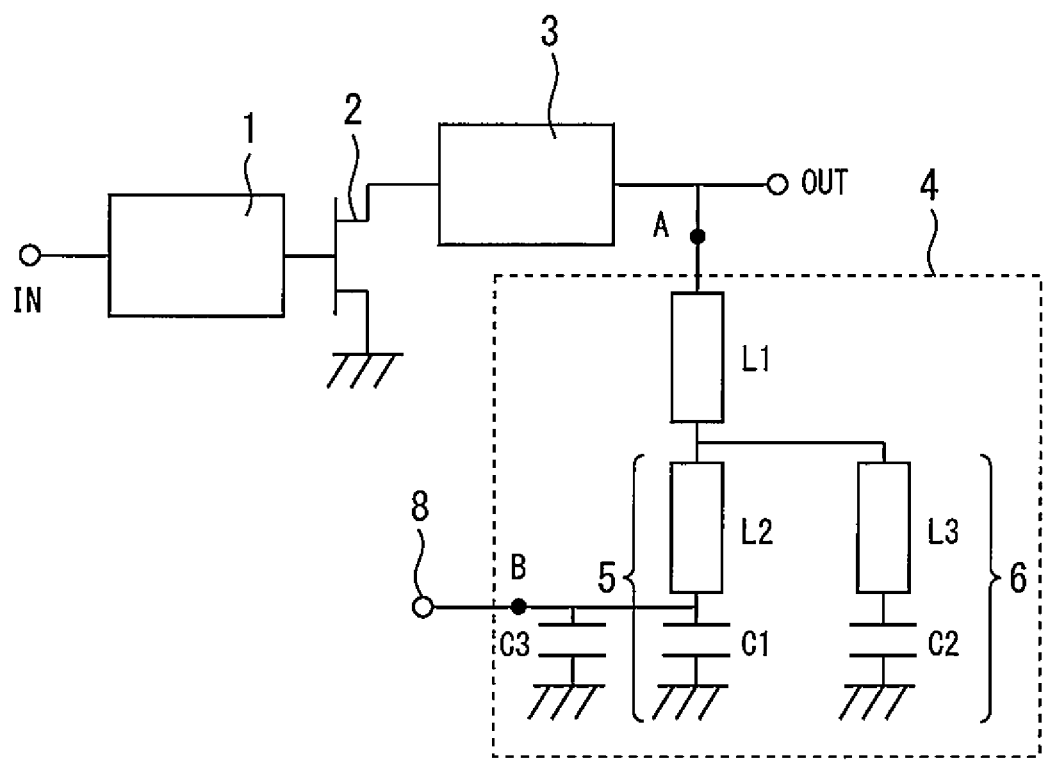
FIG. 12 is a circuit diagram illustrating a power amplifier according to a fifth embodiment of the present invention.

FIG. 12 is a circuit diagram illustrating a power amplifier according to a fifth embodiment of the present invention. In the present embodiment, in addition to the configuration of the fourth embodiment, a terminal 8 for applying a DC bias voltage to the low-frequency processing circuit 4 is connected to a connection point between the line L2 and the capacitor C3.

Since low impedance is provided through the capacitors C1 and C3 at point B at a low frequency, a fundamental frequency and a second harmonic frequency, even when the terminal 8 for applying a DC bias is connected, the influence on the DC power supply side through the terminal 8 is small. The present embodiment makes it possible to integrate the bias circuit for applying a DC bias and the low-frequency processing circuit 4 for suppressing intermodulation distortion, and a cost reduction can be expected through a reduction of the circuit scale and a reduction of the number of parts used.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-060595, filed on Mar. 24, 2015 including specification, claims, drawings and summary, on which the Convention priority of the present application is based, is incorporated herein by reference in its entirety.

What is claimed is:

1. A power amplifier comprising:
an amplifier;
an input matching circuit connected to an input of the amplifier;
an output matching circuit connected to an output of the amplifier; and
a low-frequency processing circuit connected to the input matching circuit or the output matching circuit,
wherein the low-frequency processing circuit includes a first line having a first end connected to the input matching circuit or the output matching circuit, a first shot stub connected to a second end of the first line and including a second line and a first capacitor connected in series each other, and a second short stub connected to the second end of the first line in parallel with the first short stub and including a third line and a second capacitor which are connected in series each other,
the first line has a length of $\lambda/8$, the second line has a length of $\lambda/4$, and the third line has a length of $\lambda/8$ with respect to a wavelength $\lambda$ of a fundamental frequency.

2. The power amplifier of claim 1, wherein the low-frequency processing circuit includes a resistor connected between the input matching circuit or the output matching circuit and the first line.

3. The power amplifier of claim 1, wherein the low-frequency processing circuit includes a third capacitor connected in parallel with the first capacitor.

4. The power amplifier of claim 3, further comprising a terminal for applying a DC bias voltage to the low-frequency processing circuit and connected to a connection point between the second line and the third capacitor.

5. A power amplifier comprising:
an amplifier;
an input matching circuit connected to an input of the amplifier;
an output matching circuit connected to an output of the amplifier; and
a low-frequency processing circuit connected to the input matching circuit or the output matching circuit,
wherein the low-frequency processing circuit includes a first line having a first end connected to the input matching circuit or the output matching circuit, a shot stub connected to a second end of the first line and including a second line and a first capacitor connected in series each other, and an open stub including a third line connected to the second end of the first line,
the first line has a length of $\lambda/8$, the second line has a length of $\lambda/4$, and the third line has a length of $\lambda/8$ with respect to a wavelength $\lambda$ of a fundamental frequency.

6. The power amplifier of claim 5, wherein the low-frequency processing circuit includes a resistor connected between the input matching circuit or the output matching circuit and the first line.

7. The power amplifier of claim 5, wherein the low-frequency processing circuit includes a third capacitor connected in parallel with the first capacitor.

8. The power amplifier of claim 7, further comprising a terminal for applying a DC bias voltage to the low-frequency processing circuit and connected to a connection point between the second line and the third capacitor.

* * * * *